United States Patent
Murao et al.

(10) Patent No.: US 7,666,763 B2
(45) Date of Patent: Feb. 23, 2010

(54) NANOSILICON SEMICONDUCTOR SUBSTRATE MANUFACTURING METHOD AND SEMICONDUCTOR CIRCUIT DEVICE USING NANOSILICON SEMICONDUCTOR SUBSTRATE MANUFACTURED BY THE METHOD

(75) Inventors: Yukinobu Murao, Kawasaki (JP); Akira Kumagai, Kofu (JP); Yoichiro Numasawa, Kawasaki (JP)

(73) Assignee: Canon Anelva Corporation, Kawasaki-shi, Kanagawa-ken (JP)

( * ) Notice: Subject to any disclaimer, the term of this patent is extended or adjusted under 35 U.S.C. 154(b) by 126 days.

(21) Appl. No.: 12/128,465

(22) Filed: May 28, 2008

(65) Prior Publication Data

US 2008/0296579 A1    Dec. 4, 2008

(30) Foreign Application Priority Data

May 29, 2007   (JP)   ............................. 2007-141695
May 7, 2008    (JP)   ............................. 2008-121634

(51) Int. Cl.
    *H01L 21/20*   (2006.01)
(52) U.S. Cl. .................. 438/478; 977/890; 977/936
(58) Field of Classification Search .................. None
    See application file for complete search history.

(56) References Cited

U.S. PATENT DOCUMENTS

| 7,091,138 | B2 | 8/2006 | Numasawa et al. | 438/778 |
| 7,402,505 | B1 * | 7/2008 | Krivokapic | 438/486 |
| 7,585,564 | B2 * | 9/2009 | Whiteford et al. | 428/402 |
| 2004/0150865 | A1 * | 8/2004 | Chen et al. | 359/252 |
| 2004/0197943 | A1 * | 10/2004 | Izumi et al. | 438/22 |
| 2006/0182966 | A1 * | 8/2006 | Lee et al. | 428/375 |
| 2006/0249073 | A1 | 11/2006 | Asaoka et al. | 117/84 |
| 2007/0194001 | A1 | 8/2007 | Shibagaki et al. | 219/390 |
| 2008/0128969 | A1 | 6/2008 | Shibagaki et al. | 269/287 |
| 2008/0213988 | A1 | 9/2008 | Shibagaki et al. | 438/530 |

FOREIGN PATENT DOCUMENTS

| JP | 01-145312 A | 6/1989 |
| JP | 5-47782 A | 2/1993 |
| JP | 6-216333 A | 8/1994 |

(Continued)

OTHER PUBLICATIONS

M. Shibagaki et al., "Impact of EBAS annealing on sheet resistance reduction for Al-implanted 4H-SiC (0001)", Mater. Res. Soc. Symp. Proc., vol. 911 (2006).

(Continued)

*Primary Examiner*—Scott B Geyer
(74) *Attorney, Agent, or Firm*—Fitzpatrick, Cella, Harper & Scinto (57) ABSTRACT

This invention provides a substrate structure capable of controlling the threshold voltage of a MOS transistor independently of the substrate concentration and easily suppressing a short channel effect caused by reducing the channel length. A first nanosilicon film formed from nanosilicon grains having the same grain size is formed on a silicon oxide film on the surface of a silicon substrate. A silicon nitride film is formed on the first nanosilicon film. Then, a second nanosilicon film having an average grain size different from that of the first nanosilicon film is formed. A semiconductor circuit device is formed on a thus manufactured nanosilicon semiconductor substrate.

8 Claims, 6 Drawing Sheets

FOREIGN PATENT DOCUMENTS

| | | | |
|---|---|---|---|
| JP | 2002-076358 A | | 3/2002 |
| JP | 2004-119615 A | | 4/2004 |
| JP | 2004-297034 A | | 10/2004 |
| JP | 2005-74556 A | | 3/2005 |
| JP | 2005-236080 | * | 9/2005 |
| JP | 2005-236080 A | | 9/2005 |
| JP | 2006-120663 A | | 5/2006 |
| JP | 2006-176859 | * | 7/2006 |
| WO | WO 2006/043530 A | | 4/2006 |
| WO | WO 2006/043531 A1 | | 4/2006 |
| WO | 2008/136126 A1 | | 11/2008 |
| WO | 2008/142747 A1 | | 11/2008 |

OTHER PUBLICATIONS

S. Krishnaswami et al., "A Study on the Reliability and Stability of High Voltage 4H-SiC Mosfet Devices", Materials Science Forum, vols. 527-529, pp. 1313-1316 (2006).

M. Shibagaki et al., "Development of the Novel Electron Bombardment Anneal System (EBAS) for SiC Post Ion Implantation Anneal", Materials Science Forum, vols. 483-485, pp. 609-612 (2005).

M.A. Capano et al., "Dopant Activation and Surface Morphology of Ion Implanted 4H- and 6H-Silicon Carbide", Journal of Electronic Materials, vol. 27, No. 4, pp. 370-376 (1998).

Y. Negoro et al., "Technological Aspects of Ion Implantation in SiC Device Processes", Materials Science Forum, vol. 483-485, pp. 599-604 (2005).

M. Rambach et al., "Annealing of Aluminum Implanted 4H-SiC: Comparison of Furnace and Lamp Annealing", Materials Science Forum, vols. 483-485, pp. 621-624 (2005).

M. Shibagaki et al., "Development and Investigation of EBAS-100 of 100 mm Diameter Wafer for 4H-SiC Post Ion Implantation Annealing", Materials Science Forum, vols. 527-529, pp. 807-810 (2006).

J. Senzaki et al., "Influences of postimplantation annealing conditions on resistance lowering in high-phosphorus-implanted 4H-SiC", Journal of Applied Physics, vol. 94, No. 5, pp. 2942-2947 (Sep. 1, 2003).

* cited by examiner

NANOSILICON SEMICONDUCTOR SUBSTRATE MANUFACTURING METHOD AND SEMICONDUCTOR CIRCUIT DEVICE USING NANOSILICON SEMICONDUCTOR SUBSTRATE MANUFACTURED BY THE METHOD

BACKGROUND OF THE INVENTION

1. Field of the Invention

The present invention relates to a nanosilicon semiconductor substrate manufacturing method and a semiconductor circuit device using a nanosilicon semiconductor substrate manufactured by the method.

2. Description of the Related Art

Conventionally, a semiconductor circuit device is formed on a silicon substrate having a single-crystal structure. A threshold voltage (VT) of a MOS transistor formed on the substrate is changed by, for example, executing ion implantation to forcibly dope the silicon substrate under a gate region with an impurity (Japanese Patent Laid-Open No. 5-47782). The "threshold voltage" indicates a gate voltage, and normally, VT at which a drain current starts flowing in a MOS transistor.

The ion implantation also suppresses a short channel effect that takes place when the channel length (gate length) of the MOS transistor decreases (Japanese Patent Laid-Open No. 6-216333). The "short channel effect" indicates a degradation phenomenon in a MOS transistor characteristic which occurs when microfabrication increases the electric field applied between the drain and source, extends the space-charge layer (depletion layer) near the drain, and shortens the actual channel length.

A power MOS transistor formed on a silicon substrate sometimes employs a vertical transistor structure which flows a channel current (drain current) in a direction perpendicular to the wafer surface. To do this, an opening is formed at a predetermined position of the silicon substrate by dry etching so that the silicon on the inner surface of the opening serves as a channel.

A conventional MOS transistor formed on a silicon single-crystal substrate adopts a method of doping a channel region with an impurity by ion implantation to control the threshold voltage and prevent the short channel effect caused by reducing the channel length. That is, the MOS transistor uses a method of increasing the impurity concentration in the channel region. For example, without voltage application, a depletion layer width W of a p-n junction formed between a silicon substrate and the source or drain of an n-channel MOS transistor is given by $W \propto (E_g/N_B)^{1/2}$ here $E_g$ is the bandgap energy, and $N_B$ is the substrate concentration. Ion implantation used to suppress the short channel effect increases the substrate concentration $N_B$ and decreases the depletion layer width W. The threshold voltage (VT) is given by $VT \propto (N_B)^{1/2}$. Hence, a desired threshold voltage is obtained by controlling the substrate concentration $N_B$. However, since the impurity amount (dose) of ion implantation has an upper limit, the threshold voltage (VT) cannot be more than a predetermined value. For this reason, the depletion layer width W cannot be less than a predetermined value, either.

The above-described impurity doping in the channel region by ion implantation requires activation of the doping impurity and annealing for recovering damage upon ion implantation. However, when the channel length of the MOS transistor is very short, it is necessary to prevent the source and drain diffusion layers from spreading. For this purpose, the annealing temperature must be low. At a low annealing temperature, the ion-implanted layer cannot sufficiently recover from the damage, resulting in degradation of the transistor such as a decrease in the mobility of electrical charges that move through the channel.

It is an object of the present invention to solve the above-described problem which arises when a conventional silicon MOS transistor is microfabricated.

In the power MOS transistor having the above-described vertical structure, it is very difficult to change the threshold voltage by implanting ions into the vertical channel portion of the vertical transistor. It is therefore impossible to control the threshold voltage by ion implantation. The threshold voltage is determined by the initial impurity concentration of the silicon substrate.

It is therefore another object of the present invention to control the threshold voltage of a power MOS transistor having the above-described vertical structure independently of the substrate concentration.

SUMMARY OF THE INVENTION

According to one aspect of the present invention, there is provided a method of manufacturing a nanosilicon semiconductor substrate by forming a nanosilicon film on a substrate by repeating steps of depositing a single nanosilicon layer formed from nanosilicon grains and forming an insulating film on a surface of each nanosilicon grain, the method comprising: a first step of forming, on the substrate, a first nanosilicon film formed from a plurality of nanosilicon grains; and a second step of forming, on the first nanosilicon film, a second nanosilicon film formed from a plurality of nanosilicon grains which have an average grain size different from that of the plurality of nanosilicon grains contained in the first nanosilicon film.

According to the nanosilicon semiconductor substrate manufacturing method, a nanosilicon semiconductor substrate is also provided.

According to the present invention, it is possible to control the threshold voltage of a MOS transistor independently of the substrate concentration and easily suppress the short channel effect caused by a shorter channel length.

Further features of the present invention will become apparent from the following description of exemplary embodiments (with reference to the attached drawings).

DESCRIPTION OF THE EMBODIMENTS

Preferred embodiments of the present invention will now be described in detail with reference to the accompanying drawings. Note that the constituent elements described in the embodiments are merely examples. The technical scope of the present invention is determined by the scope of claims and is not limited by the following individual embodiments.

Figure 1:
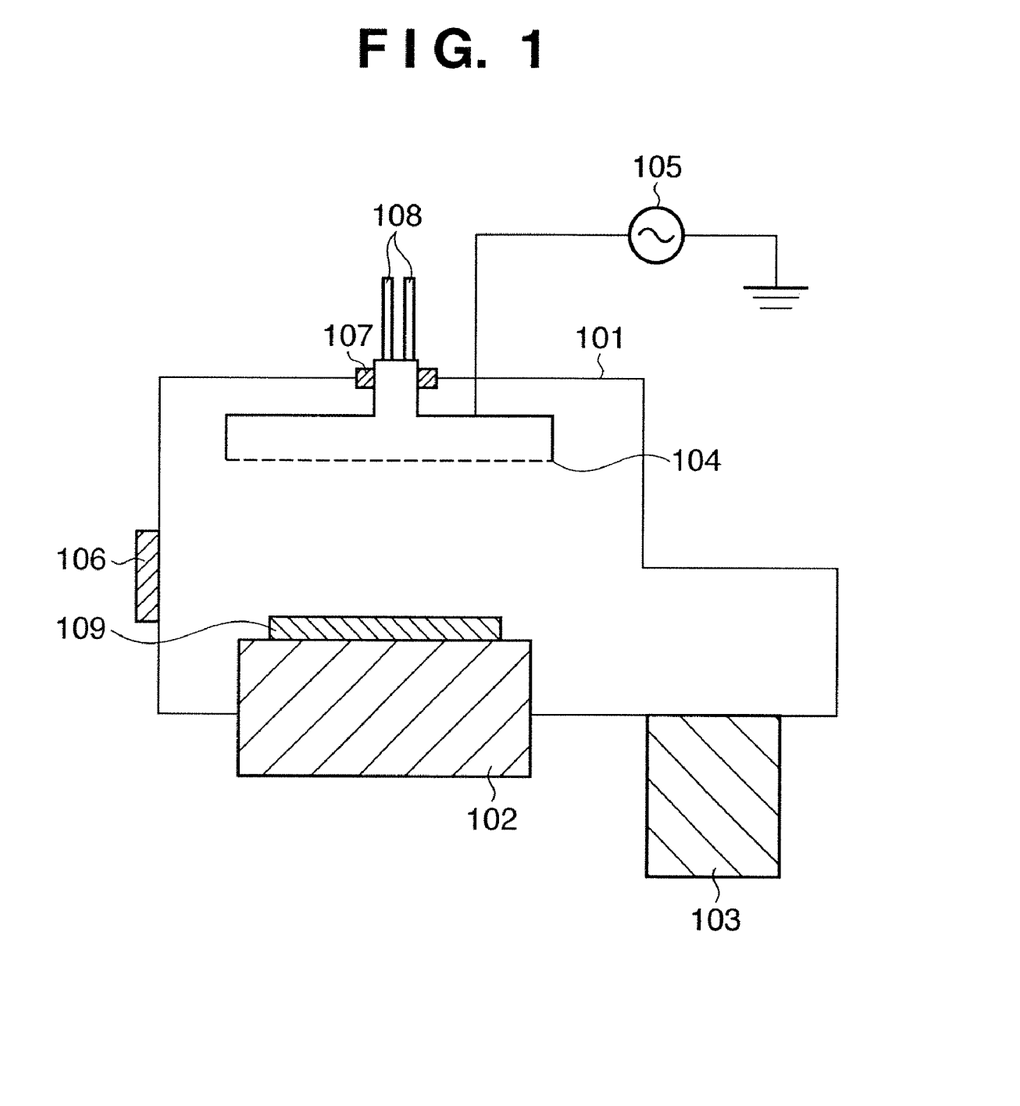
FIG. 1 is a schematic view of a nanosilicon semiconductor substrate manufacturing apparatus according to an embodiment of the present invention.

FIG. 1 is a schematic view of a nanosilicon semiconductor substrate manufacturing apparatus according to an embodiment of the present invention. A chamber 101 covers the entire apparatus. A turbo molecular pump 103 evacuates the chamber 101. A nanosilicon semiconductor substrate is formed on a silicon wafer 109 which is placed on a heat holder 102 and has an oxide film on the surface. The silicon wafer 109 is loaded and unloaded from a substrate transport port 106. The nanosilicon semiconductor substrate manufacturing apparatus has, at a position opposing the surface of the silicon wafer 109, a showerhead electrode 104 for ejecting a raw material. When an RF power supply 105 (a power supply of a frequency of 13.56 MHz in this embodiment) applies a high frequency to the showerhead electrode 104, plasma is excited. An insulating component 107 electrically insulates the showerhead electrode 104 from the chamber 101. A supply tube 108 for supplying a source material necessary for manufacturing a nanosilicon semiconductor substrate is connected to the showerhead electrode 104.

A nanosilicon semiconductor substrate manufactured using the above-described nanosilicon semiconductor substrate manufacturing apparatus and, for example, an apparatus including a CVD apparatus will be described next with reference to FIG. 2.

A silicon substrate 200 having a silicon oxide film 200A formed on its surface is loaded from the substrate transport port 106 of the nanosilicon semiconductor substrate manufacturing apparatus shown in FIG. 1 and placed on the heat holder 102. The turbo molecular pump 103 evacuates the chamber 101 in FIG. 1 to high vacuum. Then, the temperature of the heat holder 102 in FIG. 1 is set at 600° C. The silicon substrate 200 having the silicon oxide film 200A corresponds to the silicon wafer 109 in FIG. 1. Silane ($SiH_4$) and diborane ($B_2H_6$) are supplied into the chamber 101 from the source material supply tube 108 via the showerhead electrode 104 in FIG. 1. First p-type nanosilicon grains for forming a first nanosilicon layer 201-1 are formed and deposited on the silicon oxide film 200A. The film formation time is controlled so that a nanosilicon grain 201NC has a grain size of 5 nm at maximum, 3 nm at minimum, or 4 nm on average, that is, the grain size fluctuation (standard deviation) with respect to the average grain size becomes 1 nm or less. In this embodiment, p-type nanosilicon grains doped with a p-type impurity such as boron are formed. However, nanosilicon grains doped with an n-type impurity such as phosphorus or those which are doped with neither a p-type impurity nor an n-type impurity can also be selected as needed.

Supply of silane ($SiH_4$) and diborane ($B_2H_6$) is stopped. Oxygen ($O_2$) is supplied into the chamber 101 from the source material supply tube 108 via the showerhead electrode 104 in FIG. 1. The RF power supply 105 applies a high frequency of 13.56 MHz to the showerhead electrode 104 to excite plasma. The oxygen plasma forms a silicon oxide film 201S that is an insulating film on the surface of each nanosilicon grain of the first nanosilicon layer 201-1. Second and subsequent nanosilicon layers 201-2 and 201-3 are formed by the nanosilicon grain deposition and plasma oxidation step using the same gas system as in forming the first nanosilicon layer.

With this process, a first nanosilicon film 201 is formed. Note that when the desired thickness of the first nanosilicon film 201 is 100 nm, "n" of an nth nanosilicon layer 201-n is 25.

Next, the temperature of the heat holder 102 in FIG. 1 is set at 800° C. Silane ($SiH_4$) and ammonia ($NH_3$) are supplied into the chamber 101 from the source material supply tube 108 via the showerhead electrode 104 in FIG. 1 to deposit an about 20-nm thick silicon nitride film 201A.

After depositing the silicon nitride film 201A that is an insulating film, the temperature of the heat holder 102 is lowered to 600° C. again. A second nanosilicon film 202 including nanosilicon grains whose average grain size is 2 nm and whose grain size fluctuation (standard deviation) with respect to the average grain size is 1 nm or less is formed in accordance with the same procedure as that for the first nanosilicon film 201. When the nanosilicon grain size is 2 nm, nanosilicon grains having the same size are arranged among the nanosilicon grains deposited for the first time. Hence, a single nanosilicon layer is formed by the nanosilicon grain deposition of two times. That is, when the nanosilicon grain is 2 nm, the nanosilicon grain deposition and plasma oxidation step is necessary in every formation of a 2-nm thick nanosilicon layer. For example, to obtain the second nanosilicon film 202 having a thickness of 100 nm and including grains with an average grain size of 2 nm, the nanosilicon grain deposition and plasma oxidation step needs to be repeated 100 times.

Next, the temperature of the heat holder 102 in FIG. 1 is set at 800° C. again. Silane ($SiH_4$) and ammonia ($NH_3$) are supplied into the chamber 101 from the source material supply tube 108 via the showerhead electrode 104 in FIG. 1 to deposit an approximately 20-nm thick silicon nitride film 202A on the second nanosilicon film 202.

After formation of the silicon nitride film 202A, the temperature of the heat holder 102 is raised to 900° C. to execute annealing in the apparatus. That is, annealing is performed at 800° C. or more after deposition of the first and second nanosilicon films. The annealing may be done not only in the above-described hydrogen gas atmosphere but also in an atmosphere containing a hydrogen radical dissociated from hydrogen. This annealing is performed to improve the crystallinity of the nanosilicon grains and the quality of the nanosilicon surface oxide film.

In the above-described step, two kinds of nanosilicon films are deposited. A nanosilicon film formed from a plurality of nanosilicon grains having an average grain size different from that of the underlying nanosilicon film may further be deposited as needed. In depositing the plurality of kinds of nanosilicon films, different kinds of nanosilicon films may continuously be formed on the substrate having a deposited nanosilicon film using a CVD apparatus. Alternatively, the other nanosilicon films may be formed after the substrate has been extracted from the CVD apparatus and subjected to another step.

For example, the substrate surface is processed by a hydrogen radical. Silicon crystal grains are deposited using a gas containing a silicon element. Then, nanosilicon films may be formed by oxygen- or nitrogen-terminating the surface of each silicon crystal grain using an oxygen gas, oxygen radical, or nitrogen radical (Japanese Patent Laid-Open No. 2005-74556). Alternatively, the substrate surface is irradiated with Ar ions to form a nucleation reactive site of a silicon nanocrystal. Silicon nanocrystal grains having a grain size of 10 nm or less are grown in the nucleation reactive site by pyrolytic reaction of a source gas containing a silicon element. Then, nanosilicon films may be formed by oxygen-, nitrogen-, or hydrogen-terminating each silicon nanocrystal grain using an oxygen gas, oxygen radical, nitrogen radical, or hydrogen radical (Japanese Patent Laid-Open No. 2005-236080).

A semiconductor circuit device using the nanosilicon semiconductor substrate of the present invention will be described next.

Figure 2:
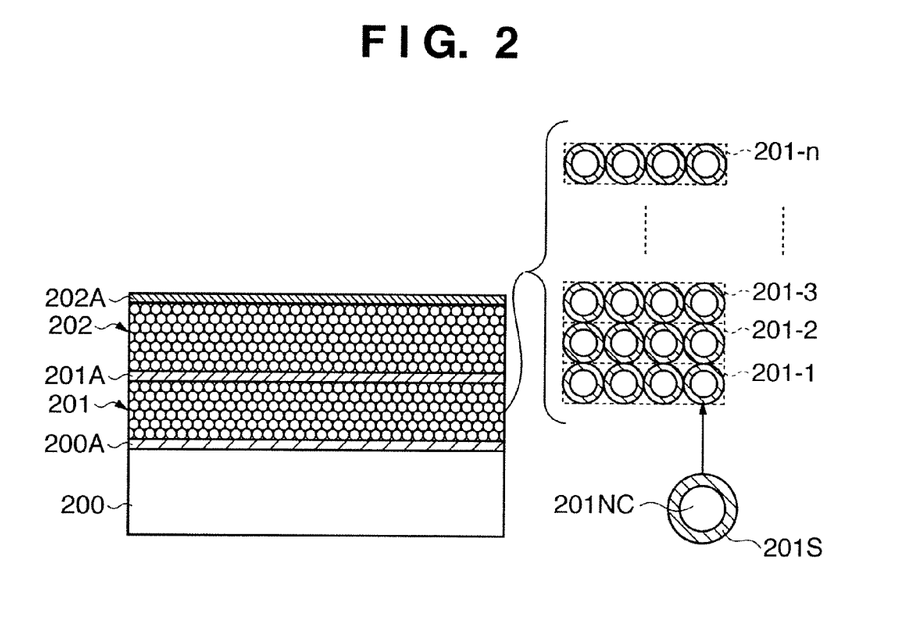
FIG. 2 is a schematic sectional view for explaining a nanosilicon semiconductor substrate manufactured using the nanosilicon semiconductor substrate manufacturing apparatus in FIG. 1.
Figure 3:
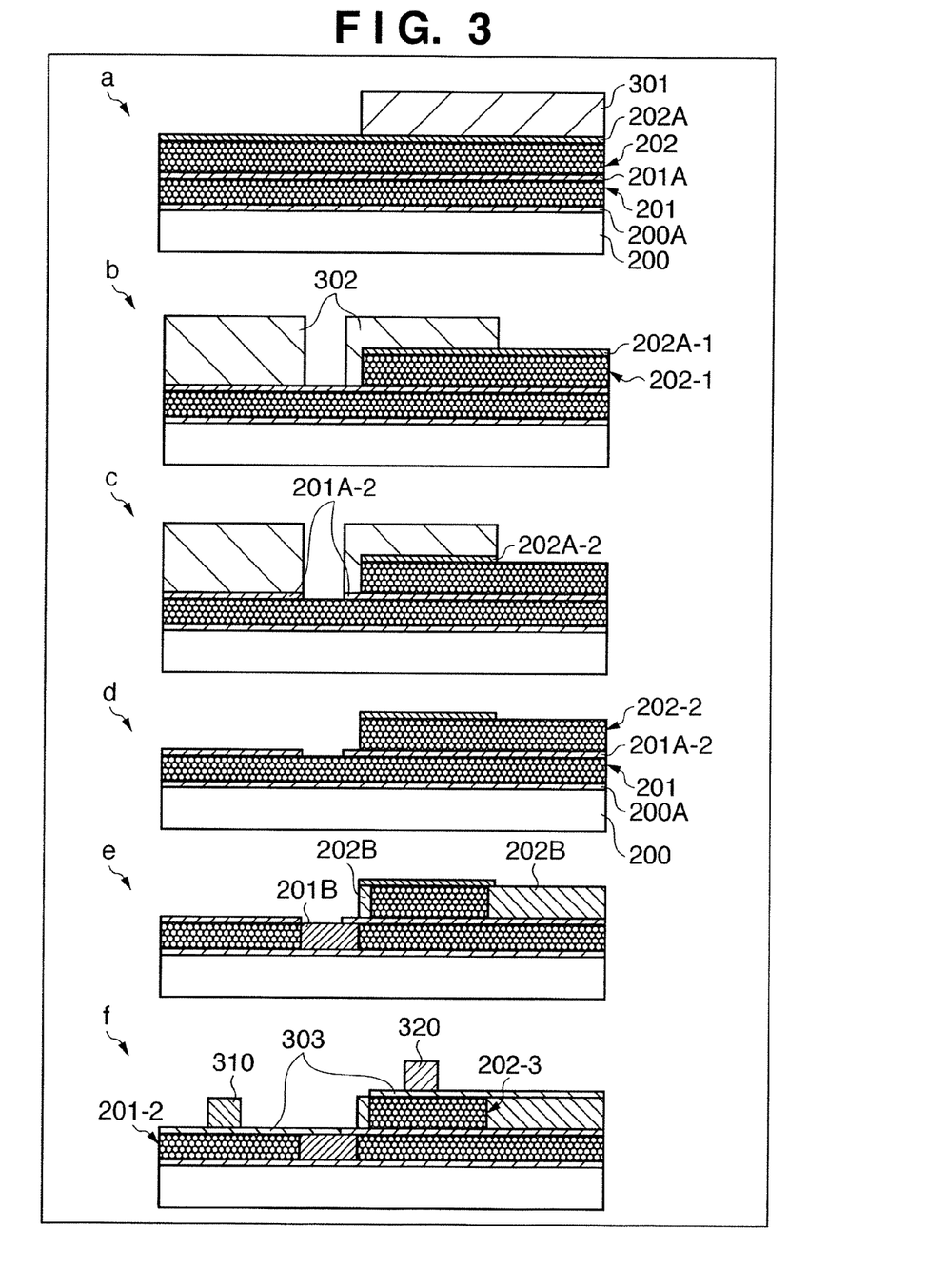
FIG. 3 is a sectional view showing the manufacturing steps and structure of a MOS transistor which is formed using the nanosilicon semiconductor substrate manufactured by the nanosilicon semiconductor substrate manufacturing apparatus of the present invention.

FIG. 3 shows the manufacturing steps and structure of a MOS transistor which is formed using the p-type nanosilicon semiconductor substrate in FIG. 2 manufactured by the nanosilicon semiconductor substrate manufacturing apparatus of the present invention.

In FIG. 3, a indicates a state in which a photoresist 301 is formed on the nanosilicon semiconductor substrate described with reference to FIG. 2 and selectively patterned by photolithography. The silicon nitride film 202A and the second nanosilicon film 202 are removed by dry etching using the thus formed photoresist 301 as a mask. Then, a silicon nitride film 202A-1 and a second nanosilicon film 202-1 are exposed in a shape indicated by b in FIG. 3. A photoresist 302 is patterned as indicated by b in FIG. 3 by photolithography.

The silicon nitride film 201A on the first nanosilicon film 201 and the silicon nitride film 202A-1 of the second nanosilicon film 202-1 are partially removed, as indicated by c in FIG. 3, by dry etching using the photoresist 302 as a mask. More specifically, silicon nitride films 201A-2 and 202A-2 are left on the first nanosilicon film 201 and the second nanosilicon film 202-1, as indicated by c in FIG. 3.

The photoresist 302 is removed to obtain a structure indicated by d in FIG. 3. Next, the first nanosilicon film 201 and the second nanosilicon film 202 are thermally oxidized using the silicon nitride films 201A-2 and 202A-2 as a mask. Then, an insulating separation oxide film 201B is formed in the first nanosilicon film 201, and an insulating separation oxide film 202B is formed in the second nanosilicon film 202.

After removing the insulating silicon nitride films 202A-2 and 201A-2, a gate insulating film 303 is formed. A gate electrode 310 is formed on the gate insulating film 303 on the first nanosilicon film 201-2. A gate electrode 320 is formed on the gate insulating film 303 on a second nanosilicon film 202-3.

In f in FIG. 3, a MOS transistor is completed by normal MOS transistor manufacturing steps such as source/drain formation, interlayer dielectric film formation, and formation of electrodes connected to the source, drain, and gate.

Figure 4:
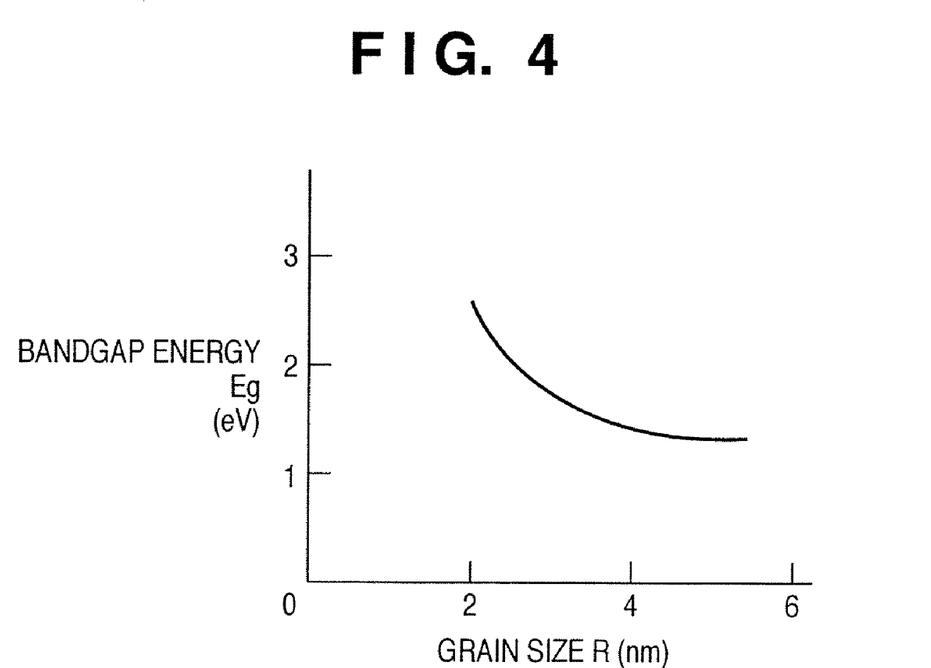
FIG. 4 is a graph showing the correlation between a nanosilicon grain size and the bandgap energy.

In the nanosilicon semiconductor substrate used in such a MOS transistor, the bandgap energy of nanosilicon changes depending on its grain size. FIG. 4 shows the correlation between the nanosilicon grain size and the bandgap energy. As the grain size becomes small, the bandgap energy becomes large.

On the other hand, a threshold voltage VT is expressed using the bandgap energy Eg by $$VT = Eg/q + (2 \cdot \epsilon_S \cdot N_B \cdot Eg/q)^{1/2}/C_{OX} \quad (1)$$

where q is the charge amount of electrons, $\epsilon_S$ is the dielectric constant of silicon, and $C_{OX}$ is the capacitance of the gate insulating film. As is apparent from Equation (1), when the nanosilicon grain size becomes small, and the bandgap energy becomes large, the threshold voltage VT can be high. In other words, the threshold voltage VT can freely be controlled by changing the nanosilicon grain size.

Hence, as described above, the threshold voltage VT of the MOS transistor on the first nanosilicon film 201-2 which is formed from nanosilicon grains having an average grain size of 4 nm is different from that of the MOS transistor on the second nanosilicon film 202-3 which is formed from nanosilicon grains having an average grain size of 2 nm. As shown in FIG. 4, the difference between the bandgap energy Eg of nanosilicon having an average grain size of 2 nm and the bandgap energy Eg of nanosilicon having an average grain size of 4 nm is about 1 eV. As can be seen from the above-described Equation (1) representing the relationship between the threshold voltage VT and the bandgap energy Eg of a MOS transistor, the difference between the threshold voltage VT of the MOS transistor on the first nanosilicon film 201-2 and that of the MOS transistor on the second nanosilicon film 202-3 is about 1 V.

Assume that the grain size fluctuation (standard deviation) on the first nanosilicon film 201-2 and the second nanosilicon film 202-3 is 1 nm or less. When each of the first nanosilicon film 201-2 and the second nanosilicon film 202-3 has, for example, 10 nanosilicon grains, the bandgap energies of the first nanosilicon film 201-2 and the second nanosilicon film 202-3 are determined by the average value of the sum of the bandgap energies of the individual nanosilicon grain sizes, as shown in FIG. 4. When the grain size fluctuation (standard deviation) is 1 nm or more, no difference is present between the first nanosilicon film 201-2 and the second nanosilicon film 202-3. As a result, it is difficult to control the threshold voltage VT.

When source and drain diffusion layers are formed by heavily doping the nanosilicon semiconductor substrate with an impurity, a device characteristic that is completely different from that in a conventional silicon single-crystal substrate is implemented. More specifically, a nanosilicon grain included in a nanosilicon film has a surface covered with an insulating film such as a silicon oxide film. This suppresses depletion layer formation in the channel region that is in contact with the source and drain. Hence, use of a nanosilicon semiconductor substrate suppresses the short channel effect.

Figure 5:
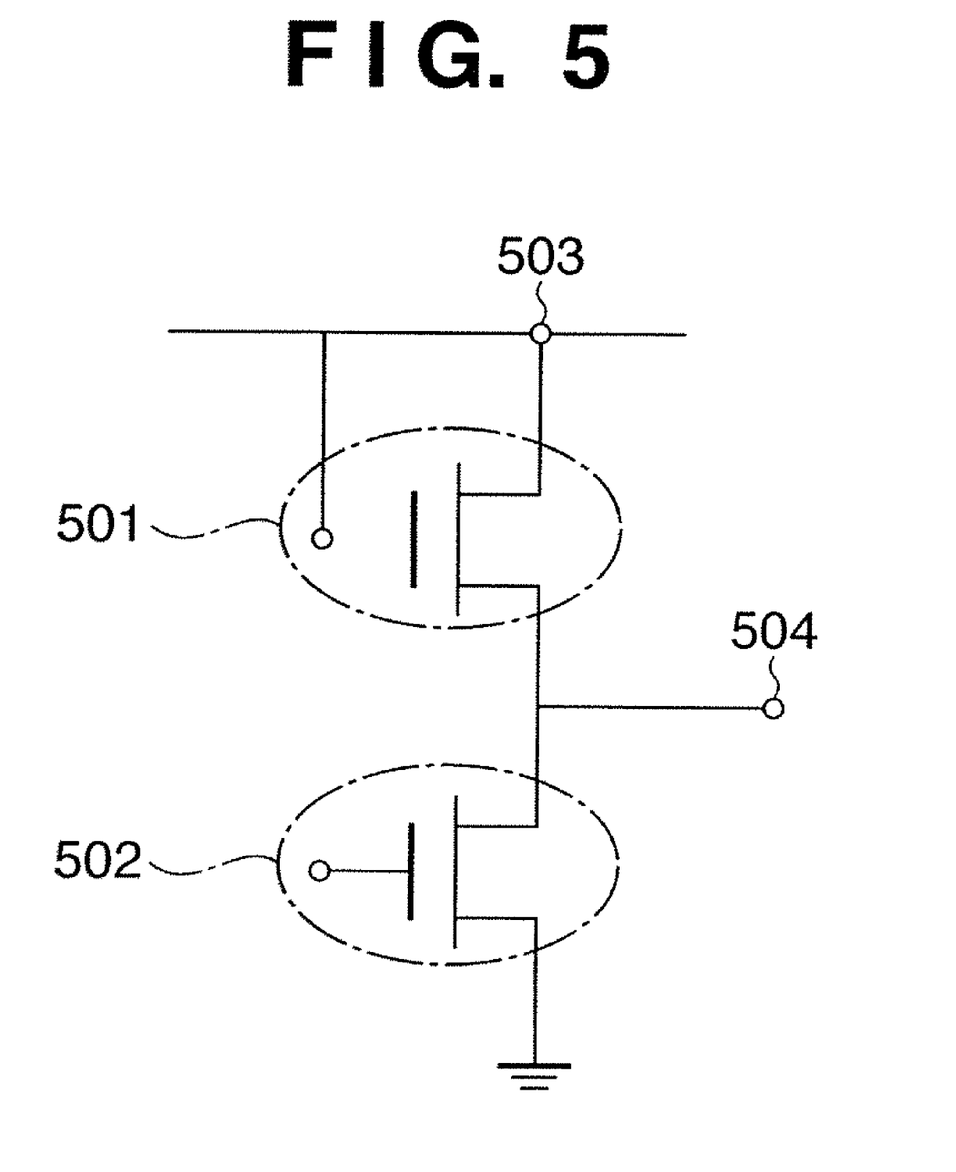
FIG. 5 is a circuit diagram showing a semiconductor circuit device using the nanosilicon semiconductor substrate manufactured using the nanosilicon semiconductor substrate manufacturing apparatus of the present invention.

The above-described MOS transistors having different threshold values are usable for, for example, an inverter circuit that is a basic circuit element of a MOS integrated circuit device. FIG. 5 is a circuit diagram of an example.

Referring to FIG. 5, a MOS transistor 501 having a lower threshold voltage VT corresponds to the MOS transistor formed on the first nanosilicon film 201-2 indicated by f in FIG. 3. On the other hand, a MOS transistor 502 having a higher threshold voltage VT corresponds to the MOS transistor formed on the second nanosilicon film 202-3.

A power supply terminal 503 applies a voltage of, for example, 2 V. When the voltage of 2 V is applied to the gate of the transistor 502, an output terminal 504 changes from 2 V to 0 V. That is, an inverter operation is performed.

Figure 6:
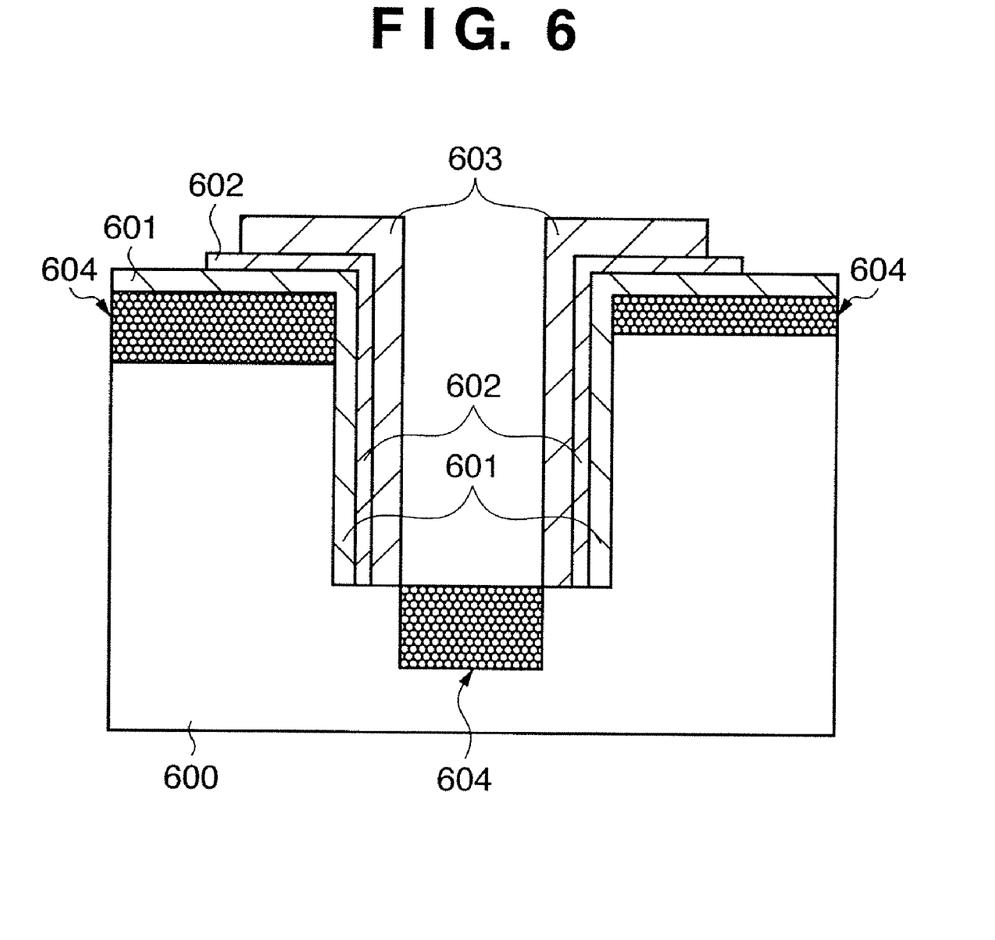
FIG. 6 is a sectional view showing the structure of a power MOS transistor according to another embodiment of the present invention.

FIG. 6 is a sectional view showing the structure of a power MOS transistor according to another embodiment of the present invention. To manufacture a vertical power MOS transistor as described in "BACKGROUND OF THE INVENTION", a trench is formed in a p-type semiconductor substrate 600, and a nanosilicon film 601 including nanosilicon grains having a grain size of 3 nm is formed on the inner surface of the trench and the peripheral surface of the opening. The nanosilicon film 601 is formed in accordance with the above-described steps using the nanosilicon semiconductor substrate manufacturing method of the present invention. A gate silicon oxide film 602 and a gate polysilicon electrode 603 are sequentially formed on the nanosilicon film 601. $N^+$-diffusion layers 604 serving as source and drain regions are formed at portions corresponding to the bottom surface and opening surface of the trench formed in the p-type semiconductor substrate 600.

The nanosilicon film 601 which is formed by CVD (Chemical Vapor Deposition) has an excellent step coverage and can therefore be deposited on the inner surface of the trench. The threshold voltage of the power MOS transistor of this embodiment is determined by the nanosilicon grain size of the nanosilicon film 601. It is therefore possible to control the threshold voltage VT independently of the concentration of the silicon substrate 600 to be used.

That is, it is possible to control the threshold voltage independently of the substrate concentration by using the nanosilicon film of the present invention in the channel region of the power MOS transistor having the above-described vertical structure. This allows increasing the breakdown voltage of the junction layer using a low-concentration substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-141695, filed May 29, 2007, and Japanese Patent Application No. 2008-121634, filed May 7, 2008, which are hereby incorporated by reference herein in their entirety.

What is claimed is:

1. A method of manufacturing a nanosilicon semiconductor substrate by forming a nanosilicon film on a substrate by repeating steps of depositing a single nanosilicon layer formed from nanosilicon grains and forming an insulating film on a surface of each nanosilicon grain, the method comprising:

a first step of forming, on the substrate, a first nanosilicon film formed from a plurality of nanosilicon grains; and a second step of forming, on the first nanosilicon film, a second nanosilicon film formed from a plurality of nanosilicon grains which have an average grain size different from that of the plurality of nanosilicon grains contained in the first nanosilicon film.

2. The method according to claim 1, wherein annealing is performed at not less than 800° C. after formation of the first nanosilicon film and the second nanosilicon film.

3. The method according to claim 2, wherein the annealing is performed in one of a hydrogen atmosphere and an atmosphere containing a hydrogen radical dissociated from hydrogen.

4. The method according to claim 1, wherein an insulating film is deposited between the first nanosilicon film and the second nanosilicon film which have different average grain sizes.

5. The method according to claim 1, wherein a grain size fluctuation with respect to the average grain size of the nanosilicon grains of the first nanosilicon film and the second nanosilicon film is not more than 1 nm.

6. A semiconductor circuit device including a circuit element formed on a nanosilicon semiconductor substrate manufactured by a nanosilicon semiconductor substrate manufacturing method of claim 1.

7. The device according to claim 6, wherein a MOS transistor is formed on each of nanosilicon films which have different average grain sizes and are selectively exposed on the nanosilicon semiconductor substrate.

8. The device according to claim 7, wherein nanosilicon grains contained in each nanosilicon film have a bandgap energy corresponding to a grain size so that the MOS transistors formed on the nanosilicon films having the different average grain sizes have different threshold voltages (VT).

* * * * *